Aug. 8, 1967 C. R. BRACKETT 3,335,328

UNIVERSAL DIODE MATRIX PACKAGE WITH IMPROVED FUSE MEANS

Filed Oct. 21, 1965

INVENTOR.
C. R. BRACKETT
BY
Robert A. Green
ATTORNEY

3,335,328
UNIVERSAL DIODE MATRIX PACKAGE WITH IMPROVED FUSE MEANS

Clyde R. Brackett, Somerville, N.J., assignor to Burroughs Corporation, Detroit, Mich., a corporation of Michigan Filed Oct. 21, 1965, Ser. No. 500,405
5 Claims. (Cl. 317—101)

This invention relates to miniature matrix devices and, particularly, to a novel diode matrix package.

There are many types of electrical circuits and systems in use today, particularly computers, which utilize circuit elements known as matrices to perform various logic functions. Such matrices comprise essentially a gridwork of crossed electrical conductors, each electrically insulated from the others, with an electrical element such as a semiconducting diode or rectifier, for example, connected between conductors at selected crossover points. In one use of such matrices, pulses having a meaning in one code, for example, binary-coded decimal, are applied to the input conductors and a signal representing a digital number is produced at each of the output conductors. The digital number so produced is normally employed as one of the constant values required in the solution of a mathematical problem by the digital computer. It can be seen that different logic operations or different codes require different matrices and different diode arrangements.

In one method of preparing diode matrices having different diode arrays, the gridwork of conductors, which is common to all matrices, is provided, and the required diodes are placed by hand in the proper locations and then they are soldered to the electrical conductors. This is a time-consuming method and one which cannot be used in mass production, particularly in mass production of matrices using tiny semiconductor devices.

In another method of preparing diode matrices having different diode arrays, the gridwork of conductors is provided and diodes are provided at all possible positions in the gridwork, and they are connected to the proper conductors. This operation can be automated and is usable. However, the operator removes undesired diodes by clipping their leads and removing them from their locations in the gridwork. This, too, is a time-consuming operation, and a near-impossible operation with miniaturized diodes and conductors.

Therefore, the preferred method of preparing different diode matrices comprises providing diodes at all locations in the gridwork of conductors and then removing them electrically by "burning" them out. The term "burning" is intended to denote that the diode is subjected to excessive forward or reverse current which destroys the diode and provides an open circuit where the burned diode was located. The diode is thus, in effect, removed from the matrix. However, sometimes, the burned out diode becomes a short circuit, rather than an open circuit, and renders the matrix unusable. For this reason, it is preferable to provide a fuse with each diode and burn out the fuse, rather than the diode, whereby an open circuit is insured.

Accordingly, the objects of the invention concern the provision of an improved miniature diode matrix package in which diodes can be removed selectively by the fuse method described above.

Briefly, a package embodying the invention includes an insulating substrate carrying a plurality of conductive lines, which comprise the gridwork to which diodes are connected at all possible matrix locations. A fuse wire is connected in series with each diode, and each fuse wise is so mounted that it is free and out of contact with surrounding materials whereby easiest burning out of the fuse can be achieved. A protective covering is positioned over the fuse wires to maintain their free mounting, and the entire package is mounted in a suitable protective medium. In order to form a specific matrix by removing selected diodes from the circuit, the proper fuse wires are opened by the passage of current therethrough and the associated diodes are thereby removed electrically from the matrix. The desired matrix remains.

The invention is described in greater detail by reference to the drawing wherein.

Figure 1:
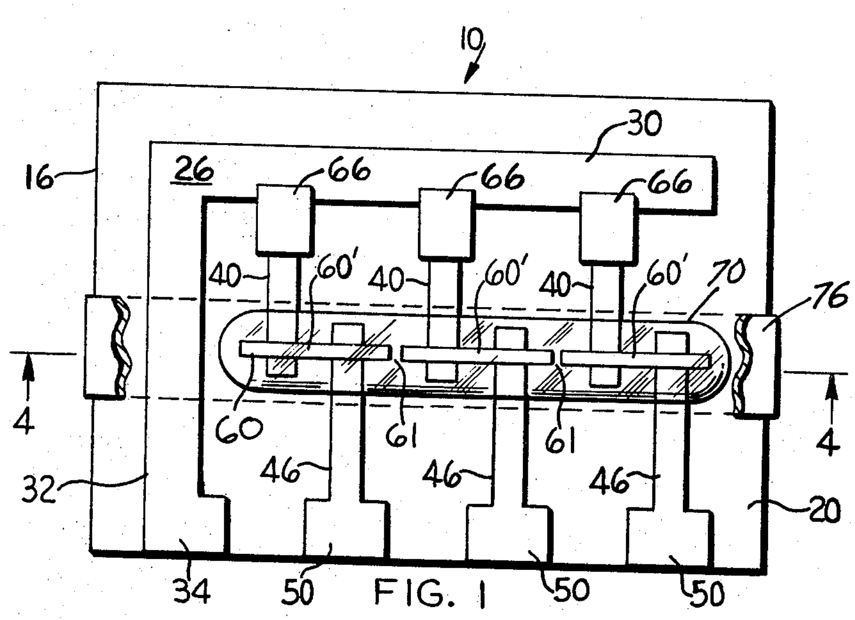
FIG. 1 is a plan view of a package embodying the invention.
Figure 4:
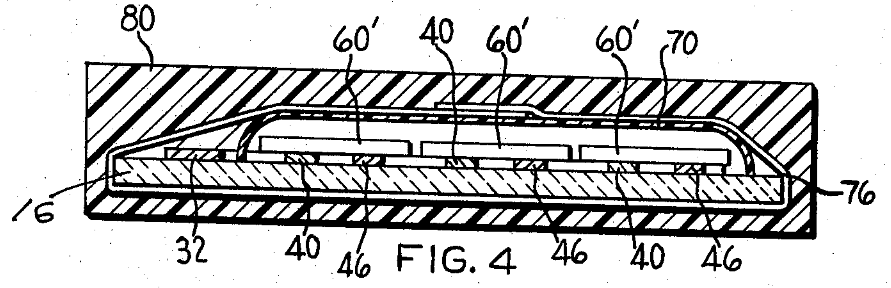
FIG. 4 is a sectional view along the line 4—4 in FIG. 1.

Referring to the drawing, the package of the invention 10 includes a substrate 16 of an insulating material such as glass, ceramic, or the like in the form of a disk, plate, wafer, or the like. The top surface 20 of plate 16 is provided with a generally L-shaped conductor 26 which may be a film of copper or the like having legs 30 and 32, with leg 32 ending in a contact pad 34. A plurality of relatively short parallel conductors 40 are provided on surface 20 originating close to leg 30 of conductor 26 and extending therefrom parallel to the leg 32. The conductors 40 terminate at any convenient location. A plurality of auxiliary conductors 46 are provided, one associated with each conductor 40 and originating near the termination of conductor 40. The conductors 40 and 46 overlap somewhat, and the auxiliary conductors 46 terminate in contact pads 50.

Figure 2:
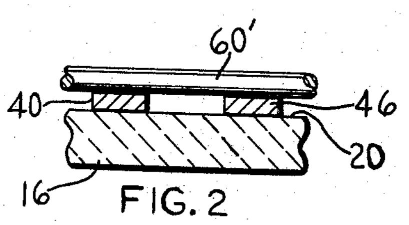
FIG. 2 is a sectional view of a portion of the package of FIG. 1.

A length of fuse wire 60, which may be of nickel or the like having a diameter of about ½ mil, is placed over the adjacent overlapping ends of conductors 40 and 46 so that it lies in contact with all of the conductors. The fuse wire is soldered or welded to each of the conductors 40 and 46. For optimum operation of the fuse wire, it should be free of all surrounding media, and, according to the invention, in order for the fuse wire to be spaced from the top surface of the substrate, the conductors 40 and 46 have sufficient thickness so that their top surfaces, on which the fuse wire rests, rise above the substrate 16, as seen in FIG. 2. The continuous length of fuse wire is broken up to provide a separate fuse wire 60' for each pair of conductors 40 and 46, and this is accomplished most conveniently by cutting the portions of the fuse wire between pairs of conductors, for example, at points 61.

Figure 3:
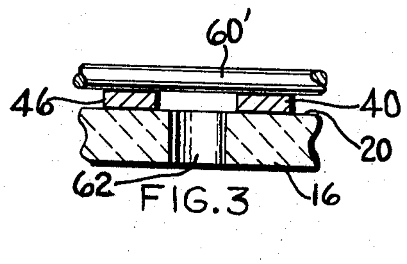
FIG. 3 is a sectional view of a portion of a modification of the package of FIG. 1.

If the conductors 40 and 46 are too thin to provide suitable spacing between the fuse wire and the top surface of the substrate, then the desired spacing can be achieved by providing a hole 62 through the substrate beneath each discrete fuse wire 60' and between the conductors 40 and 46 in each pair, as shown in FIG. 3.

A diode 66 is mounted between leg 30 of the common conductor 26 and each of the conductors 40, with one electrode connected to conductor 26 and one connected to a conductor 40. Each diode is part of a conductive path which extends from pad 50 through conductor 46, fuse wire 60', conductor 40, diode 66, and conductor 26 to common pad 34.

The electrical components of the package are now complete, and the package is provided with a protective covering which may be a metal housing or the like. Alternatively, the package may be embedded in a synthetic resinous medium which intimately engages all portions of the package. In order to protect the fuse wires 60' when the package is embedded in such a resinous medium and to keep the fuse wires free of the surrounding medium, an elongated protective plastic bubble 70 is placed over the fuse wires 60', and a length of tape 76 is wound about the substrate 16 and the bubble to hold the bubble in place. Of course, a suitable cement could be used to hold the bubble in place. This assembly is now embedded in the selected encapsulating material to provide a protective housing 80 with common pad 34 and pads 50 exposed and accessible, preferably at an edge of the substrate 16. The package thus prepared can be used to provide a desired diode matrix by passing a suitable current through the paths including undesired diodes to break the fuse wires associated therewith. The diodes having their fuse wires intact comprise the final desired matrix.

The foregoing description clearly illustrates the principles of the invention, and it will be clear to those skilled in the art that modifications may be made in the physical apparatus described while utilizing those principles.

What is claimed is:

1. A universal package for forming a matrix of electronic components comprising an insulating substrate having a top surface, a first common conductor formed on said top surface, a plurality of pairs of conductors formed on said top surface in operative relation with said common conductor, each pair including first and second spaced-apart conductors, a separate electronic component secured between each of said first conductors and said common conductors, and a fuse wire secured between the first and second conductors of each pair, said fuse wire standing free of all adjacent components.

2. The package defined in claim 1 and including a protective covering over said fuse wires maintaining said fuse wires free and out of contact with adjacent components.

3. The package defined in claim 1 and including a protective covering over said fuse wires maintaining said fuse wires free and out of contact with adjacent components, and a protective housing enclosing said substrate and the components mounted thereon and said protective covering, portions of said conductors being accessible to permit the making of connections thereto whereby current may be passed through selected fuse wires to open them and to remove from the circuit the electronic components to which the are connected.

4. A universal package for forming a diode matrix comprising an insulating substrate having a top surface, a common conductor formed on said top surface, a plurality of pairs of conductors formed on said top surface close to said common conductor, each pair including first and second spaced-apart conductors, said common conductor and each of said second conductors having a contact terminal at an edge of said substrate, a separate diode secured between said common conductor and each of said first conductors, a fuse wire secured between the first and second conductors of each pair, said fuse wire standing free of all adjacent components, and a protective medium surrounding and enclosing said fuse wires.

5. The package defined in claim 4 wherein said common conductor includes a conductive strip on said substrate and said first conductors originate close to said conductive strip and extend therefrom parallel to each other, and said second conductors originate near and overlap the end of each first conductor remote from said common conductor, said second conductors being oriented parallel to each other.

References Cited

UNITED STATES PATENTS

| | | | |
|---|---|---|---|
| 2,961,593 | 11/1960 | Kozacka | 317—40 X |
| 3,005,945 | 10/1961 | Salzer | 317—52 X |
| 3,110,855 | 11/1963 | Churmakov | 317—43 X |

ROBERT K. SCHAEFER, *Primary Examiner.*

J. R. SCOTT, *Assistant Examiner.*